April 30, 1968 K. W. WEISS 3,380,902

METHOD OF VARYING THE CONCENTRATION OF IMPURITIES IN A SEMICONDUCTOR BODY

Filed July 31, 1964

INVENTOR.
KURT W. WEISS
BY
Frank R. Trifari
AGENT 3,380,902
Patented Apr. 30, 1968

3,380,902

METHOD OF VARYING THE CONCENTRATION OF IMPURITIES IN A SEMICONDUCTOR BODY

Kurt Walter Weiss, Emmasingel, Eindhoven, Netherlands, assignor to North American Philips Company, Inc., New York, N.Y., a corporation of Delaware Filed July 31, 1964, Ser. No. 386,692
Claims priority, application Netherlands, Aug. 27, 1963, 297,199
6 Claims. (Cl. 204—140)

ABSTRACT OF THE DISCLOSURE

A method for introducing or withdrawing impurities from a semiconductor body by including it in a solid electrochemical circuit in which the body is contacted on one side by an inert electrode, and on the other side by the combination of a metal compound ionic conductor and a metal electrode of the same metal constituting the metal component of the ionic conductor. When the electrical circuit is complete, with or without an electric voltage present, impurities in the semiconductor can be caused to diffuse into the ionic conductor or visa-versa.

Figure 1:
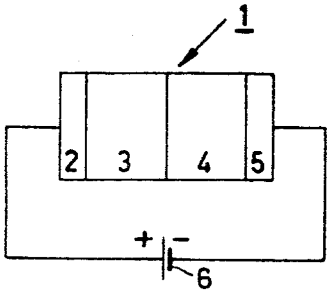

The invention relates to a method of varying the concentration of an impurity in a semiconductor body.

In semiconductor technology, the decrease of the concentration of an impurity in a semiconductor body, purifying a semiconductor body, as well as increasing the concentration of an impurity doping, is of great importance.

Various methods are known for purifying a semiconductor body. Often zone-melting is used for this purpose. This method has the drawback inter alia that impurities with a segregation coefficient approximately equal to 1 can hardly or cannot be removed from the semiconductor body.

It has already been proposed to purify a semiconductor body by setting up an electric voltage across the body and at the same time heating the semiconductor body. As a result of the electric field produced in the semiconductor body, the impurities diffuse towards an extremity of the semiconductor body, as a result of which purifying occurs. The segregation constant of the impurities in this method is of no importance. However, in this method an equilibrium condition occurs in which the diffusion of an impurity in one direction as a result of the electric field is compensated by the diffusion of the impurity in the opposite direction as a result of the gradient in the concentration of the impurity, as a result of which ultimately a gradient in the concentration of the impurity remains in the purified semiconductor body and no homogeneously purified semiconductor body is obtained.

It is an object of the invention to provide a simple method of purifying a semiconductor body in which the said drawbacks are avoided at least for the greater part.

For increasing the concentration of an impurity in the semiconductor body usually diffusion methods are used in which, for example, an impurity is diffused into the semiconductor body from the gaseous phase or from a quantity of material provided on the semiconductor body and containing the desired impurity. However, in these known methods it is difficult to diffuse an accurately defined quantity of an impurity into the semiconductor body.

It is another object of the invention to provide a simple method in which an accurately defined quantity of an impurity can be diffused into a semiconductor body.

It is noted that impurities are to be understood to mean substances which are present in a semiconductor body or which are to be provided therein and which consist of an element which does not at the same time form a composing constituent of the semiconductor material itself of which the semiconductor body consists.

According to the invention, a method of varying the concentration of an impurity in a semiconductor body is characterized in that the semiconductor body is included in a solid electrochemical circuit of the form I.E./S.C./I.C./Me where:

S.C. is the semiconductor body.

I.C. is an ionic conductor consisting of compounds having ionic conduction of the type MeX and in which the ionic conduction is greater, for example at least 1000 times greater, than the electronic conduction.

Me is a metal electrode consisting of a metal Me of a compound having ionic conduction of the ionic conductor and;

I.E. is an inert electrode, which means that this electrode can supply neither the impurity in question nor a component of the ionic conducting compounds, while as a result of diffusion of the impurity in question in the semiconductor body and the ionic conduction in the ionic conductor the impurity in question can pass the boundary surface semiconductor-ionic conductor.

The ionic conductor may consist of a compound having ionic conduction of the type MeX, or, for example, of a mixed crystal of two or more compounds having ionic conduction of the type MeX.

An important embodiment of a method according to the invention is characterized in that the concentration of the impurity in the semiconductor body is decreased, an external voltage being applied across the electrochemical circuit as a result of which the impurity diffuses out of the semiconductor body into the ionic conductor, an ionic conductor being used which is capable of absorbing the impurity, while as a result of the absorption of this impurity the ionic conduction of the ionic conductor substantially does not vary, a component of a compound having ionic conduction associated with the ionic conductor, which component as a result of the applied voltage tends to diffuse into the semiconductor body, having a diffusion coefficient in at least one of the parts of the electrochemical circuit consisting of the semiconductor body and the ionic conductor which is small with respect to the diffusion coefficient of the impurity in the relative part of the electrochemical circuit. In this manner the semiconductor body can be purified substantially entirely homogeneously.

Preferably an ionic conductor is used which contains a compound having ionic conduction of which one of the components consists of the same element as the impurity.

A further important embodiment of a method according to the invention is characterized in that the concentration of an impurity in the semiconductor body is increased, in which an ionic conductor is used which contains a compound having ionic conduction of which one component is soluble in the semiconductor body, an external electric connection being applied between the inert electrode and the metal electrode of the electrochemical circuit, as a result of which an electric current flows through the circuit, ions consisting of the said component diffusing out of the ionic conductor into the semiconductor body. The external electric connection may be an electric short-circuit between the said electrodes. By measuring the total charge which flows through a cross-section of the circuit the quantity of the impurity which is diffused in the semiconductor body can be accurately determined since the transport of charge takes place by ions which form the desired impurity in the semiconductor body. If a certain quantity of the impurity is to be diffused into the semiconductor body, the total charge is calculated which can transport this quantity of the impurity, in the form of ions and the current through the electrochemical circuit is interrupted at the instant, the total charge which has flown through a cross section of the circuit equals the calculated charge. The charge flowing through a cross section of a conductor may be determined in normal manner from the current intensity and the time during which the current flows.

Preferably an external electric connection is applied between the inert electrode and the metal electrode, which connection comprises an electric resistance element. As a result of this the current through the circuit is restricted, as a result of which the ion transport and consequently the charge transport occurs more slowly and the instant at which the desired total charge transport has taken place can be determined more accurately.

Before the external electric connection is applied between the inert electrode and the metal electrode, the electrochemical circuit has a natural electromotive force. As a result of the increase in the concentration of the impurity in the semiconductor body, during which increase the external electric connection is applied between the electrodes of the electrochemical circuit and current flows through the circuit, the natural electromotive force of the circuit decreases. It has been found that there exists a relationship between the concentration of the impurity in the semiconductor body and the natural electromotive force of the electrochemical circuit. This relationship can be determined experimentally and be derived theoretically also. Once the said relationship is determined, a semiconductor body may be doped with a desired concentration of the impurity by interrupting the passage of current through the electrochemical circuit when the natural electromotive force associated with the desired concentration is reached or by preventing—during the passage of current through the electrochemical circuit—the voltage across the electrochemical circuit from decreasing further than the voltage which corresponds to the desired electromotive force. This latter can simply be reached by means of a voltage source which is included in the external electric connection.

An important preferred embodiment of a method of increasing the concentration of impurities consequently is characterized according to the invention in that in the external electric connection a voltage source is included which is capable of maintaining a voltage difference between the inert electrode and the metal electrode which is smaller than the natural electromotive force occurring across the electrochemical circuit before the external electric connection is applied between the electrodes and by which, after the external electric connection is applied between the electrodes, the natural electromotive force across the circuit cannot decrease any further than to the said voltage difference.

In those cases in which a somewhat less great accuracy is permissible, or in which the diffusion of impurities is to be accelerated temporarily, a voltage source may advantageously be included, at least temporarily, in the external electric connection, as a result of which the diffusion of ions out of the ionic conductor into the semiconductor body is promoted.

It will be clear that in a method according to the invention not such a great voltage may be applied across the electrochemical circuit that, as a result of the passage of current, the ionic conductor is deteriorated, for example by decomposition; however, the range of permissible voltages can simply be determined experimentally.

The diffusion of impurities into the semiconductor body may in many cases be accelerated by heating the semiconductor body. The ionic conduction in the ionic conductor also may be increased in many cases by heating the ionic conductor.

Figure 2:
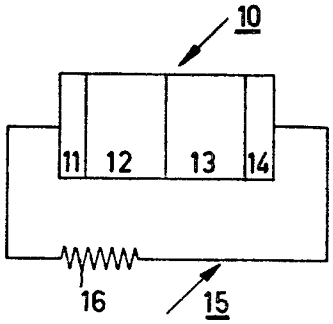

In order that the invention may readily be carried into effect, two examples thereof will now be described in greater detail, by way of example, with reference to the accompanying drawing, in which:

FIGURES 1 and 2 diagrammatically show electrochemical circuits used in a method according to the invention and having an external electric connection between the electrodes of the electrochemical circuits.

According to the invention, for varying the concentration of impurities in a semiconductor body, the semiconductor body is included in a solid electrochemical circuit of the form I.E./S.C./I.C./Me where:

S.C. is the semiconductor body,

I.C. is an ionic conductor consisting of compounds having ionic conduction of the type MeX in which the ionic conduction is greater, preferably at least 1000 times greater, than the electronic conduction.

Me is a metal electrode consisting of a metal Me of a compound having ionic conduction of the ionic conductor, and I.E. is an inert electrode, which means that this electrode can supply neither the impurity in question nor a component of the compound having ionic conduction.

In FIGURE 1 the solid electrochemical circuit is designated by 1, the inert electrode by 2, the semiconductor body by 3, the ionic conductor by 4, and the metal electrode by 5.

In the first example to be described, the semiconductor body, having the dimensions, for example, of 1 x 1 x 1 cm. consists of bismuth telluride ($Bi_2Te_3$) which contains approximately $3\times10^{18}$ silver atoms per $cm.^3$ (the impurity consisting of silver) while this impurity concentration is to be decreased. For this purpose an external voltage is applied across the electrochemical circuit 1 by means of the voltage source 6, the Me electrode 5 obtaining a negative voltage with respect to the inert electrode 2, and the silver impurity diffusing into the ionic conductor 4 in the form of ions with a positive charge under the influence of the applied voltage.

In this case an ionic conductor 4 is used which is capable of absorbing the silver impurity, while by the absorption of the silver the ionic conduction of the ionic conductor 4 substantially does not vary and in which a component of a compound having ionic conduction associated with the ionic conductor which, as a result of the applied voltage tends to diffuse into the semiconductor body, has a diffusion coefficient in at least one of the parts of the electrochemical circuit 1, which consists of the semiconductor body 3, and the ionic conductor 4, which is small with respect to the diffusion coefficient of the silver impurity in the relative part of the electrochemical circuit 1.

Preferably an ionic conductor 4 is used which comprises a compound having ionic conduction of which one of the components consists of the same element as the impurity to be absorbed, since in that case it is quite sure that the absorption of the impurity substantially does not influence the ionic conduction of the ionic conductor, while a smaller change exists of diffusion of ions from the ionic conductor into the semiconductor body, as will be explained below.

In the present embodiment, the ionic conductor 4 consists of a silver iodide body, for example, having the dimensions 1 x 1 x 1 x cm., and the electrode 5 consists of silver tin. The silver ions substantially contribute to the ionic conduction in silver iodide, while the iodine ions diffuse into the semiconductor body of bismuth telluride with difficulty.

The inert electrode 2 consists of very pure graphite.

The electrodes 2 and 5, the semiconductor body 3 and the ionic conductor 4 are forced against each other by means of a slight spring pressure, a nitrogen atmosphere being maintained in the proximity of the electrochemical circuit 1.

A voltage of 0.4 volt is applied across the circuit 1 by means of the voltage source 6, while the circuit is kept at approximately 350° C. It has been found that after approximately 24 hours the impurity concentration in the semiconductor body 3 has decreased from approximately $3\times10^{18}$ silver atoms per cm.$^3$ to approximately $3\times10^{17}$ silver atoms per cm.$^3$.

If a voltage of 0.5 volt is applied across the circuit 1, the concentration of silver atoms after approximately 24 hours appears to have decreased to approximately $4\times10^{16}$ silver atoms per cm.$^3$.

It has been found that after purifying no gradient in the impurity concentration is demonstrable in the semiconductor body 3 of bismuth telluride and consequently the semiconductor body 3 is purified substantially homogeneous.

If the voltage across the circuit 1 is maintained longer than 20 hours, no further purification of the bismuth telluride body 3 appears to occur.

It is noted that in the composition of the electrochemical circuit 1, before an external electric connection is applied between the electrodes 2 and 5, the circuit 1 has already a natural electromotive force. In the present example, this natural electromotive force was approximately 0.3 volt. For a purifying action it is necessary, that the voltage which is applied across the circuit by means of the battery 6, exceeds the natural electromotive force of the circuit 1. In addition, the voltage applied across the circuit 1 must not be so large that as a result of this voltage a current flows through the circuit which spoils the ionic conductor, for example, by intensive decomposition of the compound having ionic conduction.

The ionic conductor 4 need not consist of silver iodide but may alternatively consist, for example, of silver chloride or silver bromide.

It is also possible, for example, to use an ionic conductor which consists of lead iodide. The lead iodide itself contains no silver but can absorb silver without the ionic conductivity varying in an annoying manner. However, in that case it is possible, that some lead diffuses into the semiconductor body of bismuth telluride, in accordance with the voltage applied and the resulting silver concentration in the semiconductor body. Since in bismuth telluride lead behaves as a neutral impurity, that is to say has substantially no donor or acceptor properties, this usually is not annoying. For the rest, lead diffuses very slowly in bismuth telluride, so that only very little lead will diffuse into the bismuth telluride.

In addition, the ionic conductor 4 may be a mixed crystal of various compounds having ionic conduction and may contain, for example, silver iodide and lead iodide.

It is also possible to diffuse simultaneously various types of impurities from a semiconductor body into an ionic conductor.

For example, a germanium body which contains the impurities copper and silver may be incorporated in a fixed electrochemical circuit, the inert electrode consisting of graphite, the ionic conductor of copper iodide and the Me electrode of copper, both the silver impurity and the copper impurity diffusing from the germanium body into the ionic conductors.

The germanium body to be purified may contain so much copper that locally accumulations of copper, "copper isles" are present in the germanium body.

During the purification, the copper diffuses into the copper iodide from the germanium. Then post-supply of copper occurs because copper diffuses from the copper isles into the surrounding germanium. In this manner the copper concentration in the germanium body may be decreased to approximately $10^{10}$ copper impurities per cm.$^3$.

An example will now be described of a method according to the invention in which the concentration of impurities in the semiconductor body 12 (see FIGURE 2), will be increased and in which an ionic conductor 13 is used which contains a compound having ionic conduction of which one component, for example, the metal ion, is soluble in the semiconductor body 12, an external electric connection 15 being applied between the inert electrode 11 and the metal electrode 14 of the electrochemical circuit 10, as a result of which an electric current flows through the circuit 10, ions consisting of the said component diffusing from the ionic conductor 13 into the semiconductor body 12.

The semiconductor body 12 is a germanium body of approximately 1 x 1 x 1 cm. in which copper impurities are to be diffused. The ionic conductor 13 consists of a copper iodide body of 1 x 1 x 1 cm. The external electric connection 15 substantially forms a short-circuit between the electrodes 11 and 14, the electrode 11 consisting of graphite and the electrode 14 of copper. The parts 11, 12, 13 and 14 of the circuit 10 are again pressed against each other by means of a slight spring pressure, a nitrogen atmosphere being maintained in the proximity of the circuit and the circuit being held at approximately 400° C.

Now a current of approximately 1 $\mu$amp. flows through the circuit 10. If a concentration of, for example, $10^{14}$ copper impurities per cm.$^3$ is to be obtained in the germanium body 12, approximately $10^{14}\ A/6\times10^{23}$ of copper should be diffused into the germanium body since the germanium body has a capacity of 1 cm.$^3$. A is the atomic weight of the impurity to be diffused which, for copper, is 65 g., while $6\times10^{23}$ is the Avogadro number.

The time during which the current of 1$\mu$a. must flow through the circuit 10 may be calculated by means of the Formula 1 $G=z\times i\times t\times A/F$ where G is the weight of the impurity to be diffused, $z$ the valence of these impurities (for copper $z=1$), $i$ is the current through the electrochemical circuit, $t$ the time during which the current flows and F is the Faraday constant (=96,500 coulombs).

For the present example it may be calculated in this manner that, for obtaining a concentration of $10^{14}$ copper impurities per cm.$^3$ in the germanium body 12, the current of 1 $\mu$a. through the circuit 10 has to be interrupted after approximately 17 seconds.

By means of the Formula 1 also the quantity of charge, $i\times t$ which has to flow through the circuit 10 may be calculated.

Preferably an electric resistance element 16 is included in the external electric connection 15 as a result of which the current $i$ through the circuit is decreased and the time $t$ during which the current $i$ must flow to obtain the desired effect, is increased proportionally. As a result of this a small error in the instant at which the current through the circuit 10 is interrupted has less influence on the result of the method.

Difficulties regarding the interruption at the correct instant of the current through the circuit 10 and difficulties in determining the total quantity of charge flowed through the circuit, which difficulties may arise as a result of the occurrence of the varying space charge range at the boundary surface semiconductor ionic conductor, are avoided in an embodiment of the method according to the invention in which a voltage source is included in the external electric connection 15, which source is capable of maintaining a voltage difference between the electrodes 11 and 14 which is smaller than the natural electromotive force occurring across the electrochemical circuit 10, before the external electric connection 15 is applied between the electrodes 11 and 14 and by which, after this connection 15 is applied, the natural electromotive force of the circuit 10 cannot decrease any further than to the said voltage difference.

This preferred embodiment may simply be explained by starting from the bismuth telluride body purified by the method described with reference to FIGURE 1.

The bismuth telluride body 3 which was used as starting material in the method according to FIGURE 1, had a concentration of approximately $3\times10^{18}$ silver impurities per cm.$^3$, the natural electromotive force of the circuit 1 being approximately 0.3 volt. If a voltage of 0.4 volt was applied between the electrodes 2 and 5 by means of the voltage source 6, a concentration of approximately $3 \times 10^{17}$ silver impurities per $cm.^3$ was reached, while at a voltage of 0.5 volt a concentration of approximately $4 \times 10^{6}$ silver impurities per $cm.^3$ was obtained. If, then, the voltage source 6 is removed, the circuit 1 appears to have a natural electromotive force of approximately 0.5 volt.

If a voltage source 6 having a voltage of 0.4 volt between its electrodes is connected between the electrodes 2 and 5, the electrode 2 again being connected to the positive electrode of the voltage source 6, the above-mentioned concentration of approximately $3 \times 10^{17}$ silver atoms per $cm.^3$ in the bismuth telluride body 3 is again obtained, the natural electromotive force of the circuit 1 decreasing to approximately 0.4 volt.

If the voltage between the electrodes of the battery 6 is 0.3 volt, the bismuth telluride body 3 obtains its original silver concentration (approximately $3 \times 10^{18}$ silver atoms per $cm.^3$), the natural electromotive force of the circuit 1 decreasing to approximately 0.3 volt.

In this case the only thing to do is to wait until the current through the circuit has become stationary (the current is then no longer supported by ions but substantially entirely by electrons) after which the semiconductor body 3 with the increased silver concentration may be removed from the circuit 1.

It will be clear that the invention is not restricted to the examples described and that many variations are possible for those skilled in the art without leaving the scope of this invention.

For example, when increasing the impurity concentration in a semiconductor body a voltage source may be included in the external electric connection as a result of which the diffusions of ions from the ionic conductor into the semiconductor body is promoted. The voltage source may be included, for example, in the external electric connection 15 (see FIGURE 2), its positive electrode being connected to the metal electrode 14. A similar voltage source will in general be used only when the impurity concentration to be obtained in the semiconductor body need not particularly accurately be adjusted, or in those cases in which the impurity diffuses very slowly into the semiconductor body and/or the ionic conductor. In the examples described metal ions are diffused in or from the semiconductor body. However, also ions of the compounds having ionic conduction which are not metal ions, may be diffused into the semiconductor body or removed therefrom. In this case the negative sign of the charge of these ions should be taken into account when applying external voltages.

What is claimed is:

1. A method of varying the concentration of an impurity in a semiconductor body, comprising contacting one surface of the semiconductor body with an ionic conductor consisting essentially of a metal compound exhibiting significantly greater ionic conduction than electronic conduction, said ionic conductor in turn being contacted with an electrode of the same constituting the metal component of the ionic conductor, contacting another surface of the semiconductor body with an inert electrode free of the said impurity and free of a component of the ionic conductor, said impurity being present in the semiconductor or in the ionic conductor and being ionizable and movable as an ion, and electrically coupling the metal electrode and inert electrode forming a solid electrochemical circuit causing diffusion of the impurity across the semiconductor body-ionic conductor interface.

2. A method of decreasing the concentration of an impurity present in a semiconductor, said impurity being ionizable and movable as an ion, comprising contacting one surface of the semiconductor body with an ionic conductor consisting essentially of a metal compound exhibiting ionic conduction at least 1,000 times greater than electronic conduction, said ionic conductor being capable of absorbing any impurity which diffuses into it without substantially varying its ionic conduction and any components thereof tending to diffuse into the semiconductor having a diffusion constant in one of the semiconductor body and ionic conductor which is small relative to that of the impurity, said ionic conductor in turn being contacted with an electrode of the same metal constituting the metal component of the ionic conductor, contacting another surface of the semiconductor body with an inert electrode free of the said impurity and free of a component of the ionic conductor, and electrically coupling the metal electrode and inert electrode in series with a voltage source forming a solid electrochemical circuit causing diffusion of the impurity across the semiconductor body-ionic conductor interface into the ionic conductor.

3. A method as set forth in claim 2 wherein the ionic conductor is a compound of which one of the components is the same element as the impurity.

4. A method of increasing the concentration of an impurity in a semiconductor body, said impurity being ionizable and movable as an ion, comprising contacting one surface of the semiconductor body with an ionic conductor consisting essentially of a metal compound exhibiting ionic conduction at least 1,000 times greater than electronic conduction, said compound having a component constituting the impurity which is soluble in the semiconductor body, said ionic conductor in turn being contacted with an electrode of the same metal constituting the metal component of the ionic conductor, contacting another surface of the semiconductor body with an inert electrode free of the said impurity and free of a component of the ionic conductor, and electrically coupling the metal electrode and inert electrode forming a solid electrochemical circuit causing diffusion of the impurity component across the semiconductor body-ionic conductor interface into the semiconductor body.

5. A method as set forth in claim 4 wherein an electrical resistance is included in the electric coupling.

6. A method as set forth in claim 4 wherein a voltage source is included in the electric coupling, said voltage source establishing between the electrodes a voltage difference which is smaller than the natural electromotive force occurring across the solid electrochemical circuit.

References Cited

UNITED STATES PATENTS

| | | | |
|---|---|---|---|
| 3,078,219 | 2/1963 | Chang | 204—143 |
| 3,174,919 | 3/1965 | Spremulli | 204—130 |

FOREIGN PATENTS

| | | |
|---|---|---|
| 645,432 | 7/1962 | Canada. |

HOWARD S. WILLIAMS, *Primary Examiner.*

R. K. MIHALEK, *Assistant Examiner.*

UNITED STATES PATENT OFFICE
CERTIFICATE OF CORRECTION

Patent No. 3,380,902 April 30, 1968

Kurt Walter Weiss

It is certified that error appears in the above identified patent and that said Letters Patent are hereby corrected as shown below:

Column 4, line 64, "1 x 1 x 1 x cm" should read -- 1 x 1 x 1 cm --. Column 7, line 61, "same constituting" should read -- same metal constituting --. Column 8, line 5, "semiconductor, said" should read -- semiconductor body, said --.

Signed and sealed this 9th day of September 1969.

(SEAL)
Attest:

Edward M. Fletcher, Jr. WILLIAM E. SCHUYLER, JR.

Attesting Officer Commissioner of Patents